United States Patent
Yun et al.

(10) Patent No.: US 10,325,643 B2
(45) Date of Patent: Jun. 18, 2019

(54) METHOD OF REFRESHING MEMORY DEVICE AND MEMORY SYSTEM BASED ON STORAGE CAPACITY

(71) Applicant: SAMSUNG ELECTRONICS CO., LTD., Suwon-si, Gyeonggi-do (KR)

(72) Inventors: Chang-Ho Yun, Seongnam-si (KR); Min-Su Kim, Seongnam-si (KR); Sung-Joon Kim, Hwaseong-si (KR); So-Ra Park, Seoul (KR); Hyun-Jung Yoo, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/691,828

(22) Filed: Aug. 31, 2017

(65) Prior Publication Data
US 2018/0151218 A1    May 31, 2018

(30) Foreign Application Priority Data
Nov. 28, 2016  (KR) .......................... 10-2016-0159183

(51) Int. Cl.
*G06F 3/06* (2006.01)
*G11C 11/406* (2006.01)

(52) U.S. Cl.
CPC ...... *G11C 11/40611* (2013.01); *G06F 3/0619* (2013.01); *G06F 3/0659* (2013.01); *G06F 3/0673* (2013.01); *G11C 11/40618* (2013.01)

(58) Field of Classification Search
CPC ............. G11C 11/40611; G06F 3/0619; G06F 3/0673; G06F 3/0659
See application file for complete search history.

(56) References Cited

U.S. PATENT DOCUMENTS

| | | | |
|---|---|---|---|
| 6,172,928 B1 | 1/2001 | Ooishi | |
| 7,096,349 B1 * | 8/2006 | Hamilton | ............ G06F 13/1694 711/167 |
| 7,929,368 B2 | 4/2011 | Jeddeloh | |
| 8,576,652 B2 | 11/2013 | Koshizuka | |
| 8,619,485 B2 | 12/2013 | Klein | |
| 8,639,874 B2 | 1/2014 | Maule et al. | |
| 9,171,585 B2 | 10/2015 | Rajan et al. | |
| 9,230,610 B2 | 1/2016 | Woo et al. | |

(Continued)

Primary Examiner — Jerome Leboeuf
(74) Attorney, Agent, or Firm — F. Chau & Associates, LLC

(57) ABSTRACT

A method of operating a memory device, a first setting signal is received by a first memory device among a plurality of memory devices. The first memory device has a first storage capacity, and the memory devices may be connected to one another by a single channel. A second setting signal is received by a second memory device among the plurality of memory devices. The second memory device has a second storage capacity different from the first storage capacity. N refresh operations are performed by the first memory device based on a first refresh command and the first setting signal during a first refresh period. M refresh operations are performed by the second memory device based on a second refresh command and the second setting signal during a second refresh period. A duration of the second refresh period is substantially the same as a duration of the first refresh period.

21 Claims, 14 Drawing Sheets

(56) References Cited

U.S. PATENT DOCUMENTS

| | | | |
|---|---|---|---|
| 2008/0028137 A1* | 1/2008 | Schakel | G11C 7/04 |
| | | | 711/106 |
| 2010/0054067 A1* | 3/2010 | Mitchell, Jr. | G11O 5/04 |
| | | | 365/211 |
| 2014/0192583 A1* | 7/2014 | Rajan | G11C 7/10 |
| | | | 365/63 |
| 2014/0281202 A1* | 9/2014 | Hunter | G11C 11/40611 |
| | | | 711/106 |
| 2015/0043293 A1* | 2/2015 | Song | G11C 11/40618 |
| | | | 365/222 |
| 2016/0254043 A1 | 9/2016 | Yang | |
| 2016/0260470 A1 | 9/2016 | Ji et al. | |

* cited by examiner

METHOD OF REFRESHING MEMORY DEVICE AND MEMORY SYSTEM BASED ON STORAGE CAPACITY

CROSS-REFERENCE TO RELATED APPLICATION

This application claims priority under 35 USC § 119 from Korean Patent Application No. 10-2016-0159183, filed on Nov. 28, 2016 in the Korean Intellectual Property Office (KIPO), the contents of which are incorporated by reference herein.

1. Technical Field

Example embodiments of the inventive concept relate generally to semiconductor memory devices, and more particularly to methods of operating memory devices and methods of operating memory systems including the memory devices.

2. Discussion of the Related Art

Semiconductor memory devices can be generally divided into two categories depending upon whether they retain stored data when disconnected from power. These two categories are referred to as volatile memory devices, which lose stored data when disconnected from power, and non-volatile memory devices, which retain stored data when disconnected from power. In a volatile memory device, which is a type of semiconductor memory device, a refresh operation may be performed to retain data stored in memory cells. Researchers are conducting various research projects on techniques to impact the performance of refresh operations of the volatile memory device.

SUMMARY

At least one example embodiment of the inventive concept provides a method of operating a memory device capable of efficiently performing a refresh operation.

An embodiment of the inventive concept provides a method of operating a memory system including the memory device. According to an exemplary embodiment of the inventive concept, a method of operating a memory device includes receiving, by a first memory device from among a plurality of memory devices connected to one another by a single channel, a first setting signal, the first memory device having a first storage capacity; receiving, by a second memory device from among the plurality of memory devices, a second setting signal, the second memory device having a second storage capacity different from the first storage capacity; performing, by the first memory device, N refresh operations to refresh a charge of memory cells of the first memory device based on a first refresh command generated by a memory controller and the first setting signal during a first refresh period, where N is a natural number equal to or greater than one; and performing, by the second memory device, M refresh operations to refresh a charge of memory cells of the second memory device based on a second refresh command generated by the memory controller and the second setting signal during a second refresh period, where M is a natural number different from N, a duration of the second refresh period being substantially the same as a duration of the first refresh period.

According to an example embodiment of the inventive concept, a method of operating a memory system includes a memory controller and a plurality of memory devices that are connected to the memory controller and to one another by a single channel, a power signal is applied to the memory system. Storage capacities of the plurality of memory devices are determined. A first setting signal for a first memory device among the plurality of memory devices is generated. The first memory device has a first storage capacity. A second setting signal for a second memory device from among the plurality of memory devices is generated. The second memory device has a second storage capacity different from the first storage capacity. N refresh operations are performed for the first memory device based on a first refresh command and the first setting signal during a first refresh period, where N is a natural number equal to or greater than one. M refresh operations are performed for the second memory device based on a second refresh command and the second setting signal during a second refresh period, where M is a natural number different from N. A duration of the second refresh period is substantially the same as a duration of the first refresh period.

According to an example embodiment of the inventive concept, the memory devices that have the different storage capacities and are connected to one another by a single channel may receive the different setting signals, and thus refresh conditions of the memory devices having the different storage capacities may be differently set based on the different setting signals. Accordingly, the memory devices having the different storage capacities may perform different amounts of refresh operations, respectively, during refresh periods having the same duration, and thus the efficiency of the refresh operations may be enhanced.

According to an embodiment of the inventive concept, a memory system includes a first memory device including a first memory cell array having a first storage capacity, the first memory being connected to the memory controller by a channel; a second memory device including a second memory cell array having a second storage capacity that is different than the first storage capacity of the first memory device, the second memory device being connected to the memory controller by the channel; a memory controller including a processor configured to control a refresh operation, a data write operation, and a data read operation for at least one of the first memory device and the second memory device. The first memory device performs N refresh operations in response to a first refresh command from the memory controller based on a first setting signal during a first refresh period, where N is a natural number equal to or greater than one; and the second memory device performs M refresh operations in response to a second refresh command from the memory controller based on a second setting signal during a second refresh period, where M is a natural number different from N, a duration of the second refresh period being substantially the same as a duration of the first refresh period.

The first memory device may include a first internal register in which the first setting signal for the first refresh condition is stored, and the second memory device includes a second internal register in which the second setting signal for the second refresh condition is stored.

A third memory device including a third memory cell array having a third storage capacity that is different than the first storage capacity of the first memory device and the second storage capacity of the second memory device, in which the third memory device is connected to the memory controller by the channel, The third memory device performs K refresh operations in response to a third refresh command from the memory controller based on a third setting signal during a third refresh period, where K is a natural number different from M and from N, and a duration of the third refresh period being substantially the same as the duration of the first refresh period and the second refresh period.

The first memory device includes a first refresh control circuit that generates the first refresh address signal that is sequentially changed from a first address of the first memory cell array to a last address of the first memory cell array, and the second memory device includes a second refresh control circuit that generates the second refresh address signal that is sequentially changed from a first address of the second memory cell array to a last address of the second memory cell array.

According to an example embodiment of the inventive concept, the memory device having a relatively low storage capacity and the memory device having a relatively high storage capacity may perform the same amount of refresh operations during the reference period although the number of times in which the memory device having the relatively low storage capacity receives the refresh command during the reference period is less than the number of times in which the memory device having the relatively high storage capacity receives the refresh command during the reference period. The memory device having the relatively low storage capacity may perform other operations (e.g., data write/read operations, etc.) during a period in which a reception of the refresh command is omitted, and thus the memory system including the memory devices having different storage capacities may have enhanced performance.

BRIEF DESCRIPTION OF THE DRAWINGS

Illustrative, non-limiting example embodiments of the inventive concept will be more clearly understood from the following detailed description taken in conjunction with the accompanying drawings.

DETAILED DESCRIPTION

Figure 1:
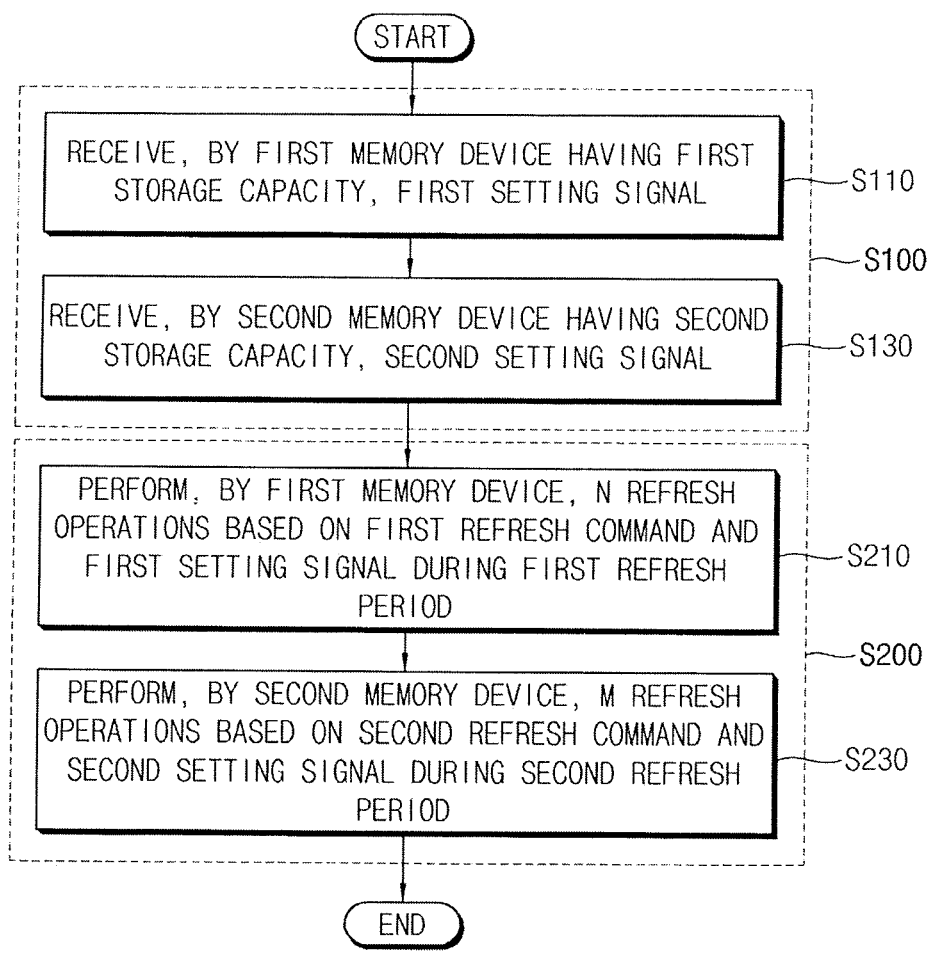
FIG. 1 is a flow chart illustrating a method of operating a memory device according to an example embodiment of the inventive concept.

At least one exemplary embodiment of the inventive concept will be described more fully with reference to the accompanying drawings. The inventive concept may, however, be embodied in many different forms and should not be construed as limited to the forms set forth herein. Like reference numerals typically refer to like elements throughout this application.

FIG. 1 is a flow chart illustrating a method of operating a memory device according to an example embodiment of the inventive concept.

Referring to FIG. 1, in a method of operating a memory device, there may be memory devices having different storage capacities that receive respective setting signals, (operation S100). The respective signals contain information that may differ based on the different storage capacities of the memory devices. In this embodiment of the inventive concept, the memory devices having the different storage capacities are included in a plurality of memory devices that are connected to one another by a single channel. Based on refresh commands and the different setting signals, the memory devices having the different storage capacities may perform different amounts of refresh operations, respectively, during refresh periods having the same duration (operation S200). By performing different amounts of refresh operations based on a storage capacity, according to the inventive concept, the efficiency of the refresh operations may be increased.

For example, FIG. 1 illustrates an example where two memory devices having different storage capacities may operate as discussed herein below.

In operation S100, a first setting signal is received by a first memory device among the plurality of memory devices (operation S110), and a second setting signal is received by a second memory device from among the plurality of memory devices (operation S130). The first memory device has a first storage capacity, and the second memory device has a second storage capacity different from the first storage capacity. For example, the first setting signal and the second setting signal may be different signals having different values.

In addition, each of the first memory device and the second memory device may be a volatile memory device. In volatile memory devices, cell charges stored in a memory cell may be lost by a leakage current. In addition, when a wordline is transitioned frequently between an active state and a precharged state (e.g., when the wordline has been accessed intensively or frequently), an affected memory cell connected to a wordline that is adjacent to the wordline frequently accessed may easily lose stored charges. Charges stored in a memory cell may be recharged before data is lost by leakage of cell charges. Such a recharge of cell charges is referred to as a refresh operation, and a refresh operation should be performed repeatedly before cell charges are irrevocably lost.

A first refresh condition that is associated with a refresh operation of the first memory device may be set based on the first setting signal, and a second refresh condition that is associated with a refresh operation of the second memory device may be set based on the second setting signal. A person of ordinary skill in the art should appreciate that the inventive concept is not limited to two setting signals, as there can be more than two memory devices with different storage capacities and refresh rates, and a quantity of setting signals based on a respective amount different storage capacities.

In operation S200, based on a first refresh command and the first setting signal, N refresh operations are performed by the first memory device during a first refresh period, where N is a natural number equal to or greater than one (operation S210). Based on a second refresh command and the second setting signal, M refresh operations are performed by the second memory device during a second refresh period, where M is a natural number different from N (operation S230). A duration of the second refresh period is substantially the same as a duration of the first refresh period. For example, the first refresh command and the second refresh command may be the same command having the same value.

A time to complete a refresh operation for all memory cells in a memory device may be different in each memory device, depending on a storage capacity of each memory device. For example, the time in which the refresh operation completes for all memory cells may increase as a storage capacity of a memory device increases (e.g., as the number of the memory cells increases), and then a refresh period may increase as the storage capacity of the memory device increases. However, according to an embodiment of the inventive concept, if memory devices having different storage capacities are connected to one another by a single channel, refresh periods of all memory devices should be set to have the same duration (e.g., the longest refresh period based on the connected memory device(s) having a longest refresh time).

According to an example embodiment of the inventive concept, the memory devices that have the different storage capacities and are connected to one another by a single channel may receive the different setting signals, and thus the refresh conditions of the memory devices having the different storage capacities may be differently set based on the different setting signals. Accordingly, the memory devices having the different storage capacities may perform different numbers (e.g. quantities, amounts) of refresh operations, respectively, during refresh periods having the same duration, and thus efficiency of the refresh operations may be improved.

Figure 2:
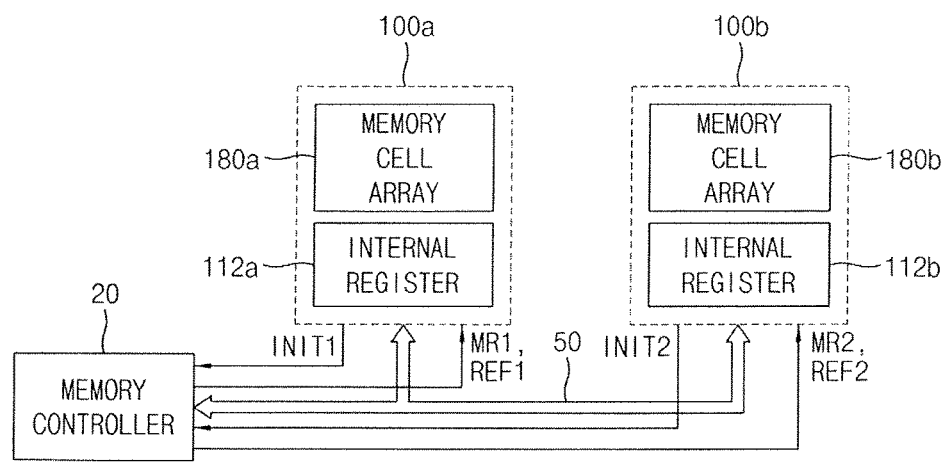
FIG. 2 is a block diagram illustrating a memory system including a memory device according to an example embodiment of the inventive concept.

FIG. 2 is a block diagram illustrating a memory system including a memory device according to an example embodiment of the inventive concept.

Referring now to FIG. 2, a memory system 10 includes a memory controller 20, a channel 50, a first memory device 100a and a second memory device 100b.

The memory controller 20 controls overall operations of the memory system 10 and is electrically connected to the channel 50. For example, the memory controller 20 may control a refresh operation, data write/read operations, etc. for at least one of the first memory device 100a and the second memory device 100b. The controller 20 may include, for example, a processor with integrated circuitry configured for operation. Machine executable code may be loaded in the memory controller and when executed control, inter alia, a refresh operation, data read/write operations.

In some example embodiments of the inventive concept, the memory controller 20 may be included in a host, e.g., a central processing unit (CPU), a microprocessor, an application processor (AP), or the like.

The first memory device 100a and the second memory device 100b are electrically connected to the channel 50, for example, via a communication interface. The first memory device 100a and the second memory device 100b may be electrically connected to each other through the channel 50. In other words, a single channel (e.g., the channel 50) may be shared by the first memory device 100a and the second memory device 100b.

Each of the first and second memory devices 100a and 100b may be, for example, a volatile memory device which loses stored data when disconnected from power. These devices may be periodically refreshed, for example, when an application or operation is active that utilizes the volatile memory device for storage. For example, each of the first and second memory devices 100a and 100b may be a dynamic random access memory (DRAM).

The first memory device 100a and the second memory device 100b have different storage capacities. The first memory device 100a may have a first storage capacity, for example, a quantity of X bytes, and the second memory device 100b may have a second storage capacity of Y bytes (e.g. different amount of bytes than the first storage capacity of the first memory device 100a. For example, the first storage capacity may be greater than (or may be less than) the second storage capacity.

With continued reference to FIG. 2, the first memory device 100a may include a first internal register 112a and a first memory cell array 180a. The second memory device 100b may include a second internal register 112b and a second memory cell array 180b. Detailed configuration of each memory device will be described with reference to FIGS. 3 and 4.

The first memory device 100a receives a first setting signal MR1 from the memory controller 20, and the second memory device 100b receives a second setting signal MR2 from the memory controller 20. The different setting signals are provided because in this example, the capacity of the first memory device 100a and the second memory device 100b may be different. As described with reference to FIG. 1, a first refresh condition for the first memory device 100a may be set based on the first setting signal MR1, and a second refresh condition for the second memory device 100b may be set based on the second setting signal MR2. The first setting signal MR1 may be stored into the first internal register 112a, and the second setting signal MR2 may be stored into the second internal register 112b.

In an example embodiment of the inventive concept, each of the first and second setting signals MR1 and MR2 may be a mode register set (MRS) code signal. For example, each of the first and second internal registers 112a and 112b may be a mode register that stores an MRS code. An artisan should understand and appreciate that the inventive concept is not limited to the first and second setting signals being a mode register set code signal.

The first memory device 100a receives a first refresh command REF1 from the memory controller 20, and the second memory device 100b receives a second refresh command REF2 from the memory controller 20.

As described with reference to FIG. 1, based on the first refresh command REF1 and the first setting signal MR1 (e.g., based on the first refresh command REF1 shown in FIG. 2, and the first refresh condition), N refresh operations may be performed for the first memory device 100a (e.g., for the first memory cell array 180a) during a first refresh period.

In addition, based on the second refresh command REF2 shown in FIG. 2, and the second setting signal MR2 (e.g., based on the second refresh command REF2 and the second refresh condition), M refresh operations may be performed for the second memory device 100b (e.g., for the second memory cell array 180b) during a second refresh period. In this example, a duration of the second refresh period is substantially the same as a duration of the first refresh period.

In an example embodiment of the inventive concept, when the first storage capacity of the first memory device 100a is greater than the second storage capacity of the second memory device 100b, M (representing the number of times in which the second memory device 100b is refreshed during the second refresh period) may be greater than N (representing the number of times in which the first memory device 100a is refreshed during the first refresh period). A relationship between a storage capacity and the number of times of refresh operations will be described in detail with reference to FIG. 7.

In an example embodiment of the inventive concept, at an initial operating time (e.g., when a power signal is applied to the memory system 10, or at a power-on state), the memory controller 20 may determine the first storage capacity of the first memory device 100a by loading a first initial setting value INIT1 for the first memory device 100a, and may determine the second storage capacity of the second memory device 100b by loading a second initial setting value INIT2 for the second memory device 100b. An operation at the initial operating time will be described in detail with reference to FIGS. 9 and 10.

Figure 3:
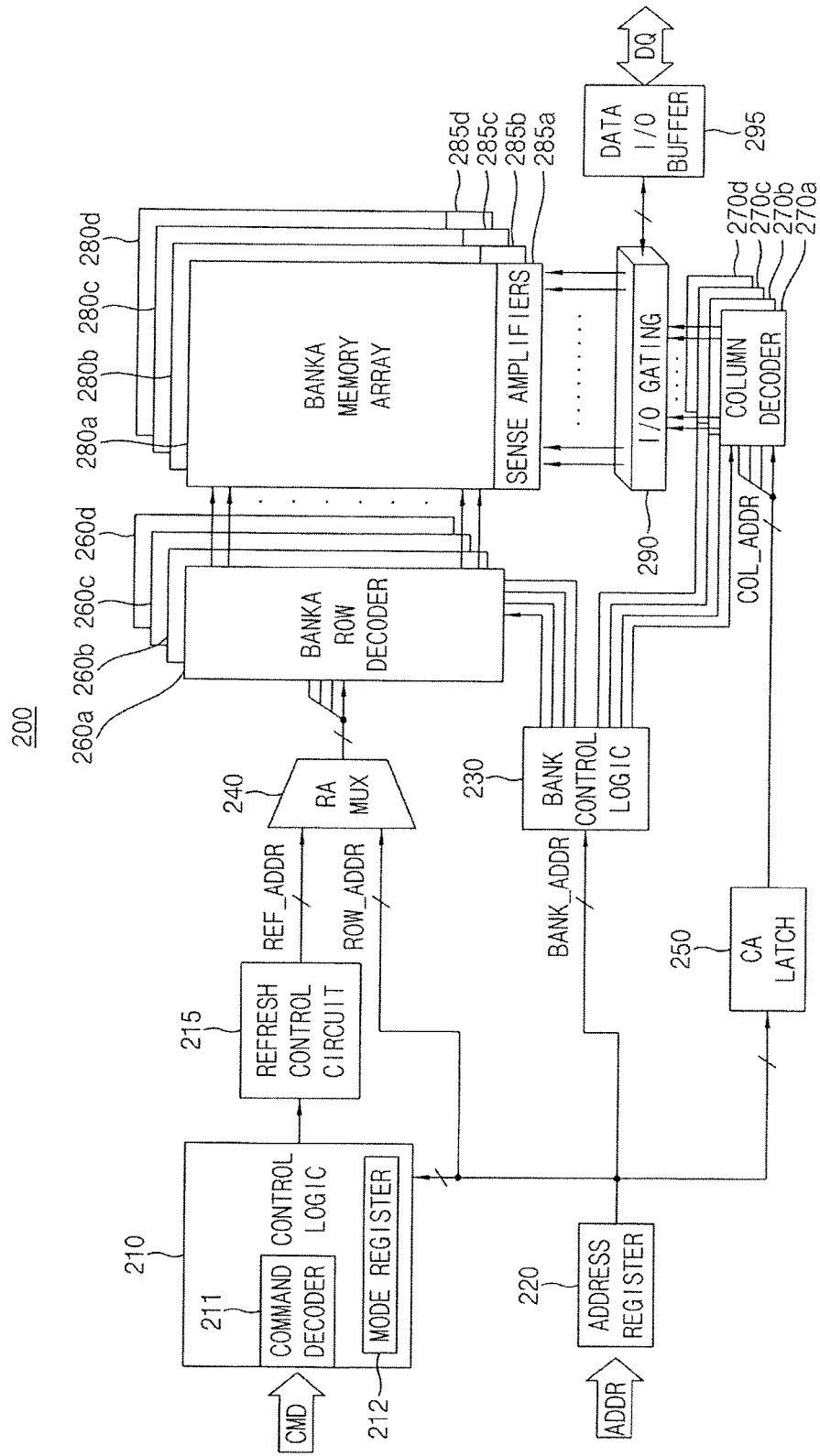
FIG. 3 is a block diagram illustrating a memory device according to an example embodiment of the inventive concept.

FIG. 3 is a block diagram illustrating a memory device according to an example embodiment of the inventive concept.

Referring to FIG. 3, a memory device 200 includes a control logic circuit 210, a refresh control circuit 215, an address register 220, a bank control logic circuit 230, a row address multiplexer 240, a column address latch 250, a row decoder 260a-260d, a column decoder 270a-270d, a memory cell array of memory bank arrays 280a-280d, a sense amplifier unit including sense amplifiers 285a-285d, an input/output (I/O) gating circuit 290 and a data I/O buffer 295. A person of ordinary skill in the art should understand and appreciate that the inventive concept is not limited to the quantities of components shown and described in FIG. 3.

The memory cell array may include a plurality of bank arrays, e.g., first through fourth bank arrays 280a, 280b, 280c and 280d. The row decoder may include a plurality of bank row decoders, e.g., first through fourth bank row decoders 260a, 260b, 260c and 260d connected to the first through fourth bank arrays 280a, 280b, 280c and 280d, respectively. The column decoder may include a plurality of bank column decoders, e.g., first through fourth bank column decoders 270a, 270b, 270c and 270d connected to the first through fourth bank arrays 280a, 280b, 280c and 280d, respectively. The sense amplifier unit includes hardware, and may include, for example a plurality of bank sense amplifiers, e.g., first through fourth bank sense amplifiers 285a, 285b, 285c and 285d connected to the first through fourth bank arrays 280a, 280b, 280c and 280d, respectively.

The first through fourth bank arrays 280a~280d, the first through fourth bank row decoders 260a~260d, the first through fourth bank column decoders 270a~270d, and the first through fourth bank sense amplifiers 285a~285d may form first through fourth banks, respectively. For example, the first bank array 280a, the first bank row decoder 260a, the first bank column decoder 270a, and the first bank sense amplifier 285a may form the first bank; the second bank array 280b, the second bank row decoder 260b, the second bank column decoder 270b, and the second bank sense amplifier 285b may form the second bank; the third bank array 280c, the third bank row decoder 260c, the third bank column decoder 270c, and the third bank sense amplifier 285c may form the third bank; and the fourth bank array 280d, the fourth bank row decoder 260d, the fourth bank column decoder 270d, and the fourth bank sense amplifier 285d may form the fourth bank. Although FIG. 3 illustrates the memory device 200 including four banks, in other example embodiments, the memory device 200 may include any number of banks. Nor is there a requirement that the components shown in FIG. 3 in quantities of four have a one-to-one correspondence with each other. In other words, there could be more or less decoders or sensors than shown.

With continued reference to FIG. 3, the address register 220 may receive an address ADDR including a bank address BANK_ADDR, a row address ROW_ADDR and a column address COL_ADDR from a memory controller (e.g., the memory controller 20 in FIG. 2). The address register 220 may provide the received bank address BANK_ADDR to the bank control logic circuit 230, may provide the received row address ROW_ADDR to the row address multiplexer 240, and may provide the received column address COL_ADDR to the column address latch 250.

The bank control logic circuit 230 may generate bank control signals in response to receipt of the bank address BANK_ADDR. One of the first through fourth bank row decoders 260a~260d corresponding to the received bank address BANK_ADDR may be activated in response to the bank control signals generated by the bank control logic circuit 230, and one of the first through fourth bank column decoders 270a~270d corresponding to the received bank address BANK_ADDR may be activated in response to the bank control signals generated by the bank control logic circuit 230.

With continued reference to FIG. 3, the refresh control circuit 215 may generate a refresh address REF_ADDR in response to receipt of a refresh command. For example, the refresh control circuit 215 may include a refresh counter that is configured to sequentially change the refresh address REF_ADDR from a first address of the memory cell array to a last address of the memory cell array. The refresh control circuit 215 may receive control signals from the control logic circuit 210.

The row address multiplexer 240 shown in FIG. 3 may receive the row address ROW_ADDR from the address register 220, and may receive the refresh address REF_ADDR from the refresh control circuit 215. The row address multiplexer 240 may selectively output the row address ROW_ADDR or the refresh address REF_ADDR. A row address output from the row address multiplexer 240 (e.g., the row address ROW_ADDR or the refresh address REF_ADDR) may be applied to the first through fourth bank row decoders 260a~260d.

The activated one of the first through fourth bank row decoders 260a~260d shown in FIG. 3 may decode the row address output from the row address multiplexer 240, and may activate a wordline corresponding to the row address. For example, the activated bank row decoder may apply a wordline driving voltage to the wordline corresponding to the row address in memory.

The column address latch 250 may receive the column address COL_ADDR from the address register 220, and may temporarily store the received column address COL_ADDR. The column address latch 250 may apply the temporarily stored or received column address COL_ADDR to the first through fourth bank column decoders 270a~270d.

The activated one of the first through fourth bank column decoders 270a~270d may decode the column address COL_ADDR output from the column address latch 250, and may control the I/O gating circuit 290 to output data corresponding to the column address COL_ADDR.

The I/O gating circuit 290 may include a circuitry for gating I/O data. For example, although not shown, the I/O gating circuit 290 may include, for example, an input data mask logic, read data latches for storing data output from the first through fourth bank arrays 280a~280d, and write drivers for writing data to the first through fourth bank arrays 280a~280d.

Data to be read from one of the first through fourth bank arrays 280a~280d may be sensed by a sense amplifier 285a~285d coupled to the one bank array, and may be stored in the read data latches. The data stored in the read data latches may be provided to the memory controller via the data I/O buffer 295 and data bus/data terminals DQ. Data received via data terminals/data bus DQ to be written to one of the first through fourth bank arrays 280a~280d may be provided from the memory controller to the data I/O buffer 295. The data received via data terminals/data bus DQ that are provided to the data I/O buffer 295 may be written, for example, to the one bank array via the write drivers in the I/O gating circuit 290.

The control logic circuit 210 may control an operation of the memory device 200. For example, the control logic circuit 210 may generate control signals for the memory device 200 to perform a write operation or a read operation. The control logic circuit 210 may include a command decoder 211 that decodes a command CMD received from the memory controller and a mode register 212 that sets an operation mode of the memory device 200. For example, the command decoder 211 may generate the control signals corresponding to the command CMD by decoding a write enable signal (e.g., /WE), a row address strobe signal (e.g., /RAS), a column address strobe signal (e.g., /CAS), a chip select signal (e.g., /CS), etc. The control logic circuit 210 may further receive a clock signal (e.g., CLK) and a clock enable signal (e.g., /CKE) for operating the memory device 200 in a synchronous manner.

In an example embodiment of the inventive concept, the memory device 200 shown in FIG. 3 may be the first memory device 100a or the second memory device 100b in FIG. 2. For example, the memory cell array (Bank A memory array) in FIG. 3 may substantially correspond to the first memory cell array 180a in FIG. 2, and the mode register 212 may substantially correspond to the first internal register 112a in FIG. 2. For another example, the memory cell array may substantially correspond to the second memory cell array 180b in FIG. 2, and the mode register 212 shown in FIG. 3 may substantially correspond to the second internal register 112b in FIG. 2.

Figure 4:
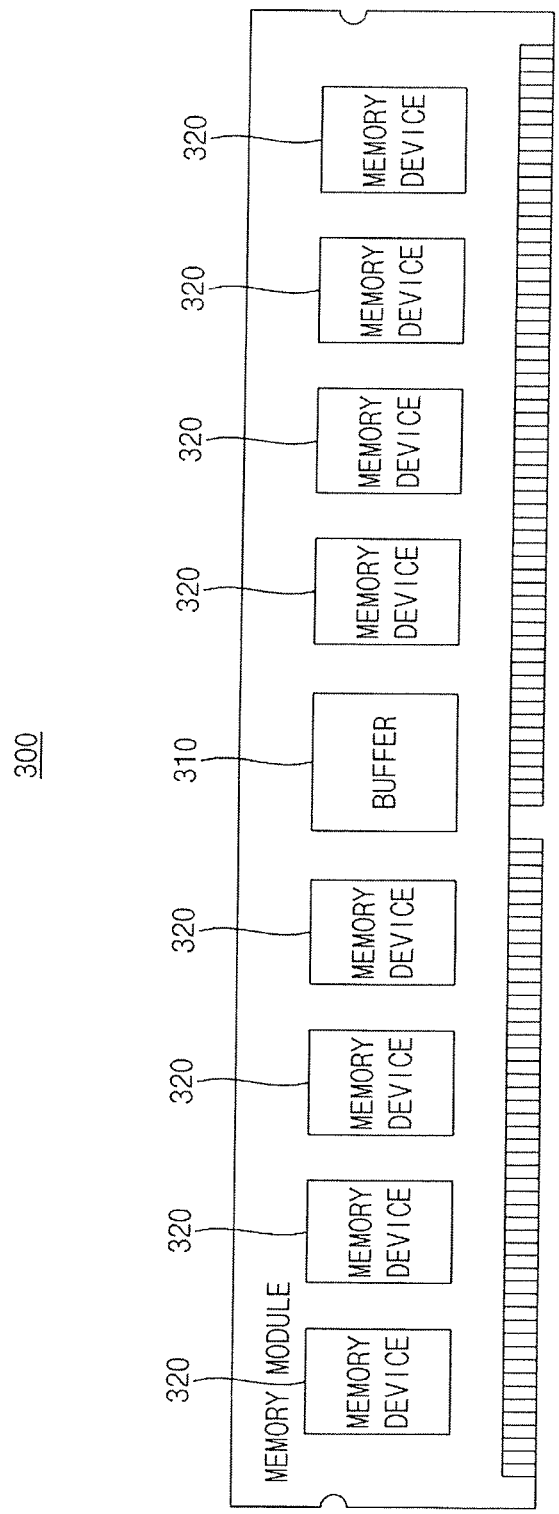
FIG. 4 is a block diagram illustrating a memory module including a memory device according to an example embodiment of the inventive concept.

FIG. 4 is a block diagram illustrating a memory module including a memory device according to an example embodiment of the inventive concept. A person of ordinary skill in the art should understand and appreciate that the memory module shown in FIG. 4 comprises hardware that may be configured for operation in various ways.

Referring to FIG. 4, a memory module 300 may include a buffer 310 and a plurality of memory devices 320. FIG. 4 shows eight memory devices 320 for illustrative purposes, but the number of memory devices 320 may be more or less than eight. The memory module 300 may be, for example, a dual in-line memory module (DIMM), e.g., a registered DIMM (RDIMM), a fully buffered DIMM (FBDIMM), a load reduced DIMM (LRDIMM), or the like.

The buffer 310 may receive a command, an address and/or data from a memory controller (e.g., the memory controller 20 in FIG. 2) through a plurality of transmission lines, and may provide the command, the address and/or the data to the plurality of memory devices 320 by initially buffering the command, the address and/or the data to buffer 310. Each of the memory devices may be implemented with a single semiconductor chip.

In an example embodiment of the inventive concept, data transmission lines between the buffer 310 and the memory devices 320 may be connected in a point-to-point topology. However, the inventive concept is not limited thereto and the command/address transmission lines between the buffer 310 and the memory devices 320 may be connected in a multi-drop topology, a daisy-chain topology, a fly-by daisy-chain topology, or the like. Since the buffer 310 in this example buffers all of the command, the address and the data, the memory controller may interface with the memory module 300 by driving only a load of the buffer 310. Accordingly, the memory module 300 may include more memory devices 320 and/or more memory ranks, and a memory system may include more memory modules.

Although not illustrated in FIG. 4, the buffer 310 may be omitted. For example, the memory module 300 may be an unbuffered DIMM (UDIMM) that does not include the buffer 310.

In an example embodiment of the inventive concept, each of the plurality of memory devices 320 may be the first memory device 100a or the second memory device 100b in FIG. 2. In other words, the first memory device 100a or the second memory device 100b in FIG. 2 may be mounted on a memory module. Memory devices having the same storage capacity may be mounted on a single memory module. For example, the first memory device 100a having the first storage capacity may be mounted on a first memory module, and the second memory device 100b having the second storage capacity different from the first storage capacity may be mounted on a second memory module different from the first memory module.

In an example embodiment of the present inventive concept, a total storage capacity of the first memory module including the first memory device 100a may be different from a total storage capacity of the second memory module including the second memory device 100b. For example, if the number of memory devices 100a included in the first memory module is substantially the same as the number of memory devices 100b included in the second memory module, the total storage capacity of the first memory module may be different from the total storage capacity of the second memory module, because the first storage capacity of the memory device 100a is different from the second storage capacity of the memory device 100b.

In an example embodiment of the inventive concept, a total storage capacity of the first memory module including the first memory device 100a may be substantially the same as a total storage capacity of the second memory module including the second memory device 100b. For example, if the first storage capacity of the memory device 100a is about twice the second storage capacity of the memory device 100b, and if the number of memory devices 100a included in the first memory module is about a half of the number of memory devices 100b included in the second memory module, the total storage capacity of the first memory module may be substantially the same as the total storage capacity of the second memory module.

Figure 5:
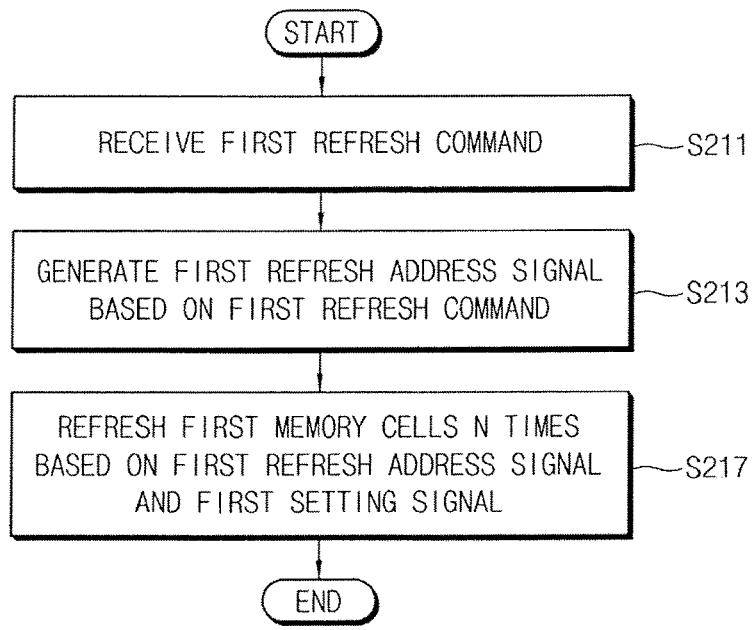
FIG. 5 is a flow chart illustrating an example of performing N refresh operations in FIG. 1.
Figure 6:
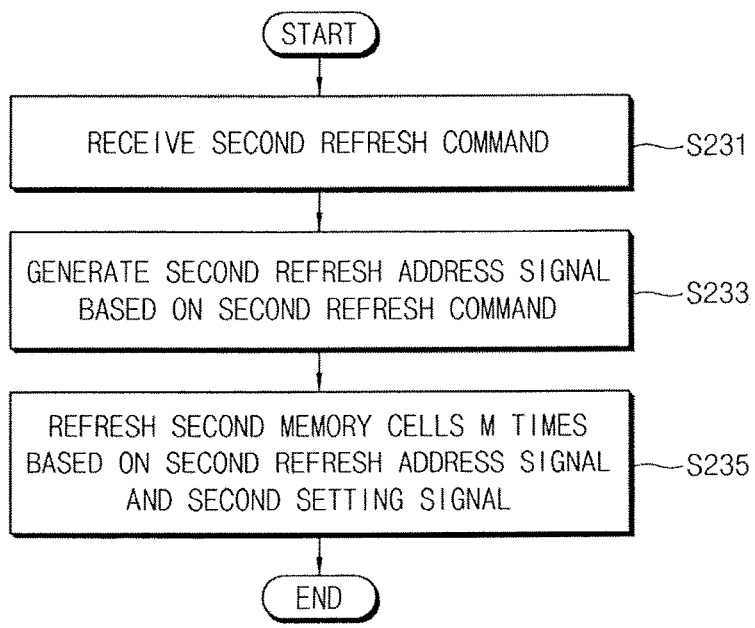
FIG. 6 is a flow chart illustrating an example of performing M refresh operations in FIG. 1.
Figure 7:
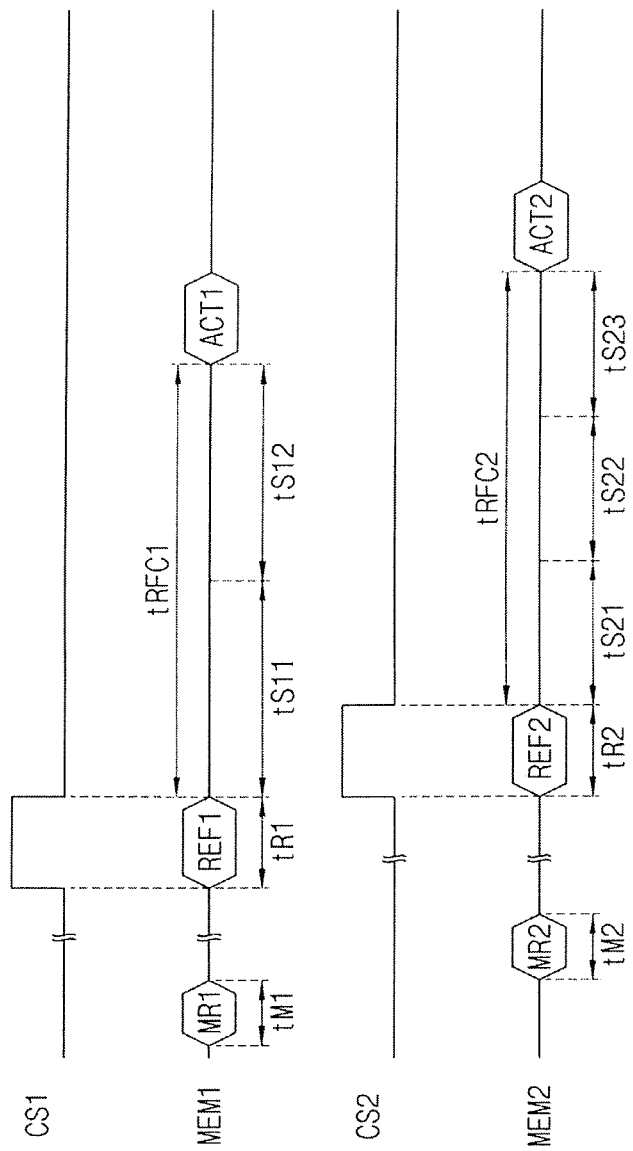
FIGS. 7 and 8 are diagrams for describing the method of operating the memory device of FIG. 1.
Figure 8:
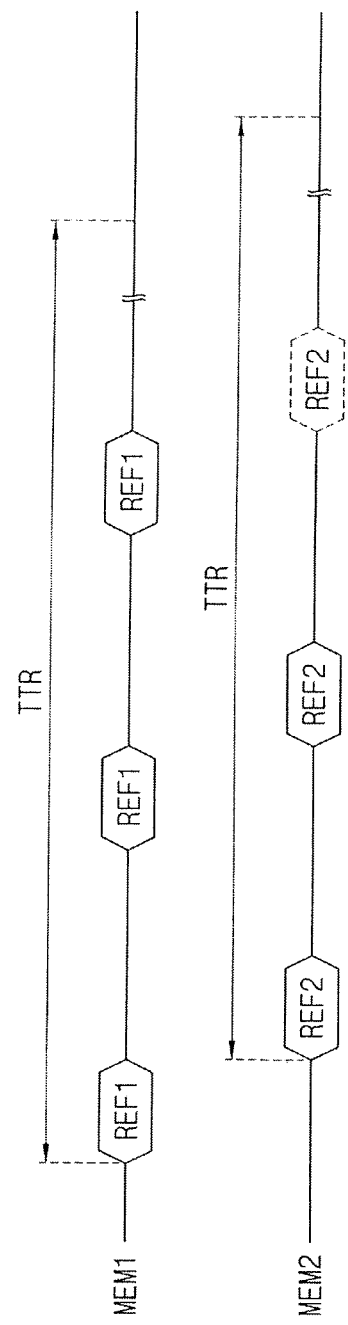

FIG. 5 is a flow chart illustrating an example of performing N refresh operations in FIG. 1. FIG. 6 is a flow chart illustrating an example of performing M refresh operations in FIG. 1. FIGS. 7 and 8 are diagrams illustrating the method of operating the memory device of FIG. 1.

In FIGS. 7 and 8, "MEM1" represents signals that are generated from the memory controller 20 and are received by the first memory device 100a shown in FIG. 2, and "MEM2" represents signals that are generated from the memory controller 20 and are received by the second memory device 100b shown in FIG. 2. In FIG. 7, "CS1" represents a first selection signal (e.g., a first chip selection signal) for selecting the first memory device 100a, and "CS2" represents a second selection signal (e.g., a second chip selection signal) for selecting the second memory device 100b. For convenience of illustration, FIG. 8 illustrates only refresh commands REF1 and REF2.

Referring now to FIGS. 1, 2, 5 and 7, before the N refresh operations for the first memory device 100a are performed, during a period tM1, the memory controller 20 generates the first setting signal MR1, and the first memory device 100a receives the first setting signal MR1 from the memory controller 20 through the channel 50 (e.g., operation S110 in FIG. 1). The first refresh condition for the first memory device 100a may be set based on the first setting signal MR1, and the first setting signal MR1 may be stored into the first internal register 112a included in the first memory device 100a.

In operation S210, to perform the N refresh operations for the first memory device 100a, during a period tR1 after the period tM1, the memory controller 20 may generate the first refresh command REF1, the first memory device 100a may be selected based on an activated first selection signal CS1, and the first memory device 100a may receive the first refresh command REF1 from the memory controller 20 through the channel 50 (operation S211 in FIG. 5).

The first memory device 100a may generate a first refresh address signal based on the first refresh command REF1 (operation S213 in FIG. 5). For example, a first refresh control circuit (e.g., the refresh control circuit 215 in FIG. 3) included in the first memory device 100a may generate the first refresh address signal that is sequentially changed from a first address of the first memory cell array 180a to a last address of the first memory cell array 180a.

Based on the first refresh address signal and the first setting signal MR1, a plurality of first memory cells included in the first memory device 100a may be refreshed N times during a first refresh period tRFC1 (operation S217 in FIG. 5). For example, the first refresh condition for the first memory device 100a may be checked by loading the first setting signal MR1 that is stored in the first internal register 112a, and the plurality of first memory cells may be refreshed N times based on the first refresh address signal and the first refresh condition during the first refresh period tRFC1 (see FIG. 7).

In an example embodiment of the inventive concept, the first refresh period tRFC1 may represent a time interval from a time point at which the first refresh command REF1 is received (e.g., at which a reception of the first refresh command REF1 is completed) to a time point at which a first active command ACT1 is received after the reception of the first refresh command REF1 (e.g., at which the first memory device 100a begins to receive the first active command ACT1). For example, a duration or length of the first refresh period tRFC1 in this example may be about 350 ns.

In an example embodiment of the present disclosure, N may be a natural number equal to or greater than two. In other words, a plurality of (e.g., more than two) refresh operations may be performed for the plurality of first memory cells based on a single first refresh command REF1. The first refresh period tRFC1 may include N sub periods, and the plurality of first memory cells may be refreshed once during each of the N sub periods. For example, as illustrated in FIG. 7, if N is about two, the first refresh period tRFC1 may include two sub-periods tS11 and tS12. Thus, in this example, if the first refresh period tRFC1 is about 350 ns, then the two sub-periods, if evenly arranged, would have a duration of about 175 ns each. The first memory cells may be refreshed once during the first sub-period tS11, and may be refreshed once again during the second sub-period tS12 after the first sub-period tS11. For example, the first refresh address signal may be sequentially changed from the first address to the last address of the first memory cell array 180a during the first sub-period tS11, and may be sequentially changed again from the first address to the last address of the first memory cell array 180a during the second sub-period tS12, and thus the first memory cells may be refreshed once based on the first refresh address signal during each of the sub-periods tS11 and tS12.

Referring to FIGS. 1, 2, 6 and 7, before the M refresh operations for the second memory device 100b are performed, during a period tM2 after the period tM1, the memory controller 20 generates the second setting signal MR2, and the second memory device 100b receives the second setting signal MR2 from the memory controller 20 through the channel 50 (e.g., operation S130 in FIG. 1). The second refresh condition for the second memory device 100b may be set based on the second setting signal MR2. The second setting signal MR2 may have a value different from that of the first setting signal MR1, and may be stored into the second internal register 112b included in the second memory device 100b.

Although not illustrated in FIG. 7, the first and second setting signals MR1 and MR2 may be substantially simultaneously or concurrently generated and provided to the respective memory devices via the memory controller. For example, according to an embodiment of the inventive concept, the first and second selection signals CS1 and CS2 may be activated to provide the first and second setting signals MR1 and MR2 to the first and second memory devices 100a and 100b, respectively.

In operation S230, to perform the M refresh operations for the second memory device 100b, during a period tR2 after the period tM2 and the period tR1, the memory controller 20 may generate the second refresh command REF2, the second memory device 100b may be selected based on an activated second selection signal CS2, and the second memory device 100b may receive the second refresh command REF2 from the memory controller 20 through the channel 50 (operation S231). The second refresh command REF2 may have a value substantially the same as that of the first refresh command REF1, and the first and second refresh commands REF1 and REF2 may be sequentially generated.

The second memory device 100b may generate a second refresh address signal based on the second refresh command REF2 (operation S233). For example, a second refresh control circuit (e.g., the refresh control circuit 215 in FIG. 3) included in the second memory device 100b may generate the second refresh address signal that is sequentially changed from a first address of the second memory cell array 180b to a last address of the second memory cell array 180b. The first address to the last address of the second memory cell may be refreshed.

More particularly, based on the second refresh address signal and the second setting signal MR2, a plurality of second memory cells included in the second memory device 100b may be refreshed M times during a second refresh period tRFC2 (operation S235 in FIG. 6). For example, the second refresh condition for the second memory device 100b may be checked by loading the second setting signal MR2 that is stored in the second internal register 112b, and the plurality of second memory cells may be refreshed M times based on the second refresh address signal and the second refresh condition during the second refresh period tRFC2.

In an example embodiment of the inventive concept, the second refresh period tRFC2 may represent a time interval from a time point at which the second refresh command REF2 is received to a time point at which a second active command ACT2 is received after the reception of the second refresh command REF2. For example, a duration or length of the second refresh period tRFC2 may be substantially the same as that of the first refresh period tRFC1.

In an example embodiment of the inventive concept, M may be a natural number equal to or greater than two. In other words, a plurality of (e.g., more than two) refresh operations may be performed for the plurality of second memory cells based on a single second refresh command REF2. The second refresh period tRFC2 may include M sub-periods, and the plurality of second memory cells may be refreshed once during each of the M sub-periods. In an embodiment, when the first storage capacity (e.g., about 8 GB) of the first memory device 100a is greater than the second storage capacity (e.g., about 4 GB) of the second memory device 100b, M may be greater than N. For example, as illustrated in FIG. 7, if N is about two and M is about three, the second refresh period tRFC2 may include three sub-periods tS21, tS22 and tS23. The second memory cells may be refreshed once during the first sub-periods tS21, may be refreshed once again during the second sub-period tS22 after the first sub-period tS21, and may be further refreshed once during the third sub-period tS23 after the second sub-period tS22. For example, the second refresh address signal may be sequentially changed from the first address to the last address of the second memory cell array 180b during each of the sub-periods tS21, tS22 and tS23, and thus the second memory cells may be refreshed once based on the second refresh address signal during each of the sub-periods tS21, tS22 and tS23.

Although FIG. 7 illustrates an example where there is shown two or three refresh operations are performed during a single refresh period, according to the inventive concept the number of refresh operations that are performed during the single refresh period may be changed to satisfy predetermined conditions associated with a storage capacity of each memory device. Although FIG. 7 illustrates an example where a duration or length of a single sub-period is substantially the same as 1/N or 1/M of a duration or length of a single refresh period (e.g., tS11=tRFC1*(½), or tS21=tRFC2*(⅓)), the duration or length of the single sub-period may be less than 1/N or 1/M of the duration or length of the single refresh period (e.g., tS11<tRFC1*(½), or tS21<tRFC2*(⅓)) according to an example embodiment of the inventive concept.

Referring now to FIGS. 7 and 8, the number of times in which the second memory device 100b receives the second refresh command REF2 during a reference period TTR may be less than the number of times in which the first memory device 100a receives the first refresh command REF1 during the reference period TTR. However, the total number of times in which the second memory device 100b performs the refresh operation during the reference period TTR may be substantially the same as the total number of times in which the first memory device 100a performs the refresh operation during the reference period TTR, even though the second memory device 100b may have received the second refresh command REF2 fewer times during the reference period TTR as compared to the first memory device. The reference period TTR may include the first and second refresh periods tRFC1 and tRFC2.

For example, the total number of times in which a single memory device performs the refresh operation during the reference period TTR should be set by a predetermined criterion, standard or specification. Such a predetermined criterion, standard, or specification may be based on, for example, information regarding how often a row should be refreshed for a memory device having a particular storage capacity. For example, a refresh should occur before cell charges stored in a memory cell may be lost by a leakage current. For a memory device of a particular type and a known storage capacity, it may be determined a frequency and a duration of a refresh operation.

In addition, as described with reference to FIG. 7, the first storage capacity of the first memory device 100a may be greater than the second storage capacity of the second memory device 100b, and then the first memory device 100a may perform two refresh operations based on a single first refresh command REF1 during a single first refresh period tRFC1, and the second memory device 100b may perform three refresh operations based on a single second refresh command REF2 during a single second refresh period tRFC2. In this example, the first memory device 100a may perform six refresh operations by receiving the first refresh command REF1 three times, and the second memory device 100b may perform six refresh operations by receiving the second refresh command REF2 only two times. Accordingly, as illustrated in FIG. 8, the number of times in which the second memory device 100b receives the second refresh command REF2 during the reference period TTR may be less than the number of times in which the first memory device 100a receives the first refresh command REF1 during the reference period TTR, thus the second memory device 100b (e.g. MEM2) shows two refresh commands (and dashed lines around another REF2) whereas the first memory device 100a (e.g. MEM1) shows three refresh commands.

In other words, according to an example embodiment of the inventive concept, although the number of times in which each memory device performs the refresh operation during a single refresh period is differently set depending on a storage capacity of each memory device (e.g., when the number of times in which each memory device performs the refresh operation during the single refresh period increases as the storage capacity of each memory device decreases), and although the number of times in which the second memory device 100b having a relatively low storage capacity receives the second refresh command REF2 during the reference period TTR is less than the number of times in which the first memory device 100a having a relatively high storage capacity receives the first refresh command REF1 during the reference period TTR, the total number of times in which the second memory device 100b performs the refresh operation during the reference period TTR should be set to be substantially the same as the total number of times in which the first memory device 100a performs the refresh operation during the reference period TTR. The second memory device 100b may perform other operations (e.g., data write/read operations, etc.) during a period (e.g., dotted lines in FIG. 8) in which a reception of the second refresh command REF2 is omitted, and thus a memory system including the first and second memory devices 100a and 100b may have relatively improved performance.

Figure 9:
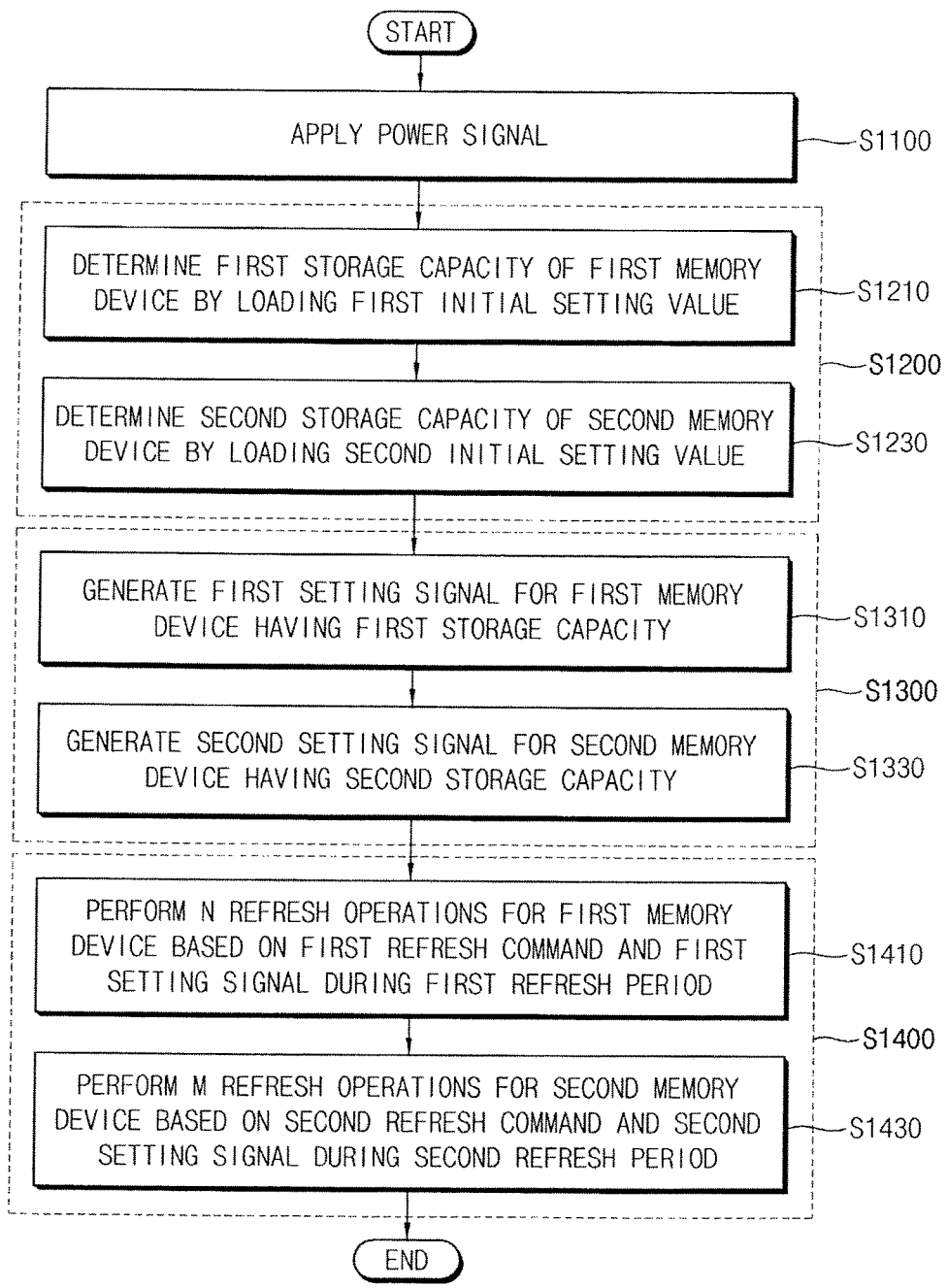
FIG. 9 is a flow chart illustrating a method of operating a memory system according to an example embodiment of the inventive concept.

FIG. 9 is a flow chart illustrating a method of operating a memory system according to an example embodiment of the present invention.

Referring to FIG. 9, in a method of operating a memory system according to at least this example embodiment, the memory system includes a memory controller and a plurality of memory devices that are connected to the memory controller and to one another by a single channel. A power signal is applied to the memory system (operation S1100). Storage capacities of the plurality of memory devices are determined by the memory controller (operation S1200). Different setting signals for memory devices having different storage capacities are generated by the memory controller (operation S1300). Based on refresh commands and the different setting signals, different numbers of refresh operations are performed for the memory devices having the different storage capacities, respectively, during refresh periods having the same duration (operation S1400).

For example, FIG. 9 illustrates an example where a memory system (e.g., the memory system 10 in FIG. 2) that includes a memory controller (e.g., the memory controller 20 in FIG. 2) and two memory devices (e.g., the memory devices 100a and 100b in FIG. 2) having different storage capacities operates based on the method according to example embodiments.

In operation S1200, a first storage capacity of the first memory device 100a may be determined, by the memory controller 20, by loading a first initial setting value INT1 for the first memory device 100a (operation S1210). A second storage capacity of the second memory device 100b may be determined, by the memory controller 20, by loading a second initial setting value INIT2 for the second memory device 100b (operation S1230).

There are a number of ways that the initial values INT1 and INIT2 may be stored and the values obtained by the memory controller. For example, the first and second initial setting values INIT1 and INIT2 may be stored in the first and second memory devices 100a and 100b (e.g., in read-only memories (ROMs) included in the first and second memory devices 100a and 100b), respectively. Alternatively, or in addition to, as described with reference to FIG. 4, when the first and second memory devices 100a and 100b are mounted on first and second memory modules, respectively, the first and second initial setting values INIT1 and INIT2 may be stored in buffers included in the first and second memory modules, respectively. The inventive concept is not limited to the aforementioned examples regarding where the initial values INT1 and INIT2 may be stored as discussed herein above.

In operation S1300, a first setting signal MR1 for the first memory device 100a having the first storage capacity is generated by the memory controller (operation S1310), and a second setting signal MR2 for the second memory device 100b having the second storage capacity is generated by the memory controller (operation S1330). The second storage capacity is different from the first storage capacity. As described with reference to FIG. 1, the first setting signal MR1 and the second setting signal MR2 may be different signals having different values, and refresh conditions of the first and second memory devices 100a and 100b may be set based on the first and second setting signals MR1 and MR2, respectively.

In operation S1400, based on a first refresh command REF1 and the first setting signal MR1, N refresh operations are performed for the first memory device 100a during a first refresh period, where N is a natural number equal to or greater than one (operation S1410). In addition to N refresh operations being performed for the first memory device 100a during a first refresh period, there are M refresh operations performed for the second memory device 100b.

In operation S1430, based on a second refresh command REF2 and the second setting signal MR2, there are M refresh operations which are performed for the second memory device 100b during a second refresh period, wherein M is a natural number different from N (operation S1430). A duration of the second refresh period is substantially the same as a duration of the first refresh period. As described with reference to FIG. 1, the first refresh command and the second refresh command may be the same command having the same value. Operations S1410 and S1430 may be substantially the same as operations S210 and S230 in FIG. 1, respectively.

Figure 10:
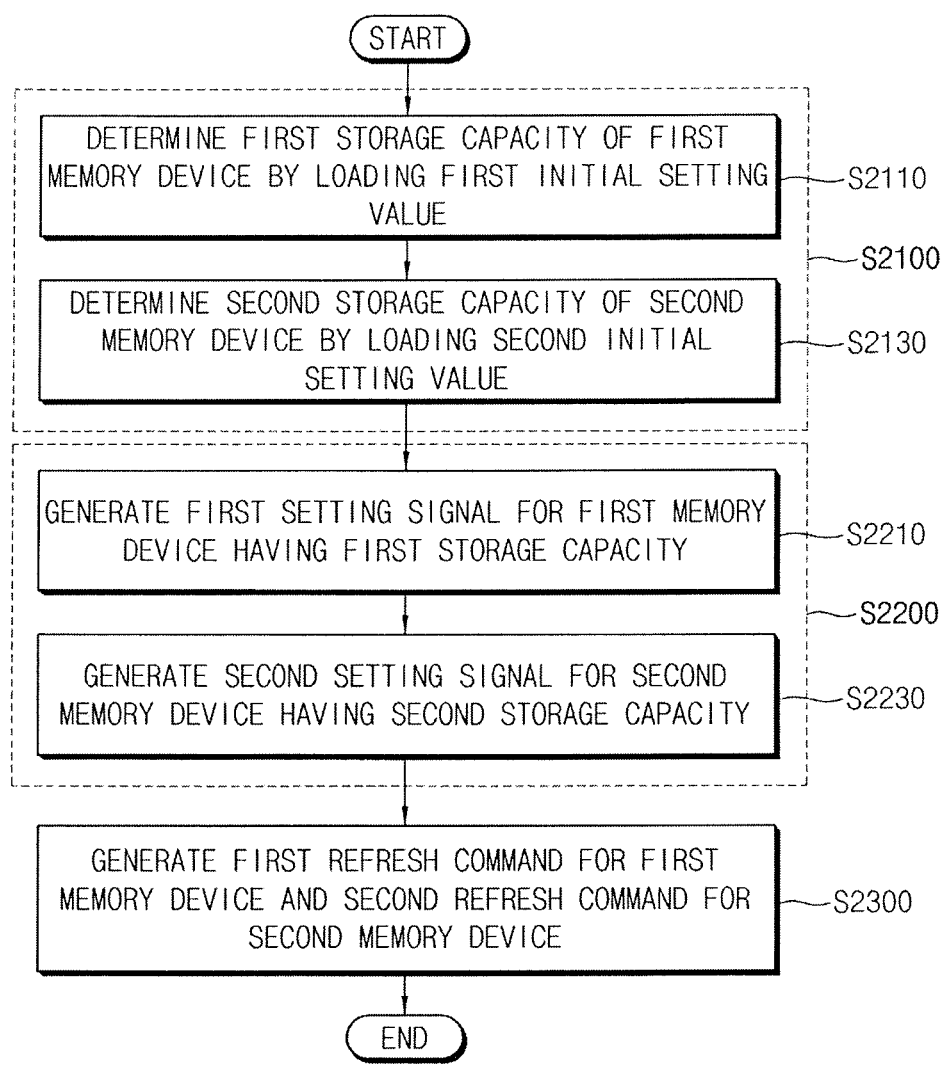
FIG. 10 is a flow chart illustrating a method of operating a memory controller according to an example embodiment of the inventive concept.

FIG. 10 is a flow chart illustrating a method of operating a memory controller according to an example embodiment of the inventive concept.

Referring to FIG. 10, in a method of operating a memory controller according to an embodiment, the memory controller is connected to a plurality of memory devices by a single channel. In an overview of the method according to FIG. 10, in operation S2100, the storage capacities of the plurality of memory devices are determined by the memory controller. Different setting signals for memory devices having different storage capacities are generated by the memory controller (operation S2200). Refresh commands for the memory devices having the different storage capacities are generated by the memory controller (operation S2300) such that different numbers of refresh operations are performed for the memory devices having the different storage capacities, respectively, during refresh periods having the same duration.

For example, FIG. 10 illustrates an example where a memory controller (e.g., the memory controller 20 in FIG. 2) that is connected to two memory devices (e.g., the memory devices 100a and 100b in FIG. 2) having different storage capacities operates based on the method according to an example embodiment of the inventive concept.

In more detail, in operation S2100, a first storage capacity of the first memory device 100a may be determined, by the memory controller 20 loading a first initial setting value INIT1 for the first memory device 100a (operation S2110). A second storage capacity of the second memory device 100b may be determined, by the memory controller 20, by loading a second initial setting value INIT2 for the second memory device 100b (operation S2130). In operation S2200, a first setting signal MR1 for the first memory device 100a having the first storage capacity is generated by the memory controller (operation S2210), and a second setting signal MR2 for the second memory device 100b having the second storage capacity is generated by the memory controller (operation S2230). The second storage capacity is different from the first storage capacity. Operations S2110, S2130, S2210 and S2230 may be substantially the same as operations S1210, S1230, S1310 and S1330 in FIG. 9, respectively.

In operation S2300, a first refresh command REF1 for the first memory device 100a and a second refresh command REF2 for the second memory device 100b are generated by the memory controller. As described with reference to FIGS. 1 and 9, the first memory device 100a performs N refresh operations based on the first refresh command REF1 and the first setting signal MR1 during a first refresh period, and the second memory device 100b performs M refresh operations based on the second refresh command REF2 and the second setting signal MR2 during a second refresh period. A duration of the second refresh period is substantially the same as a duration of the first refresh period.

Figure 11:
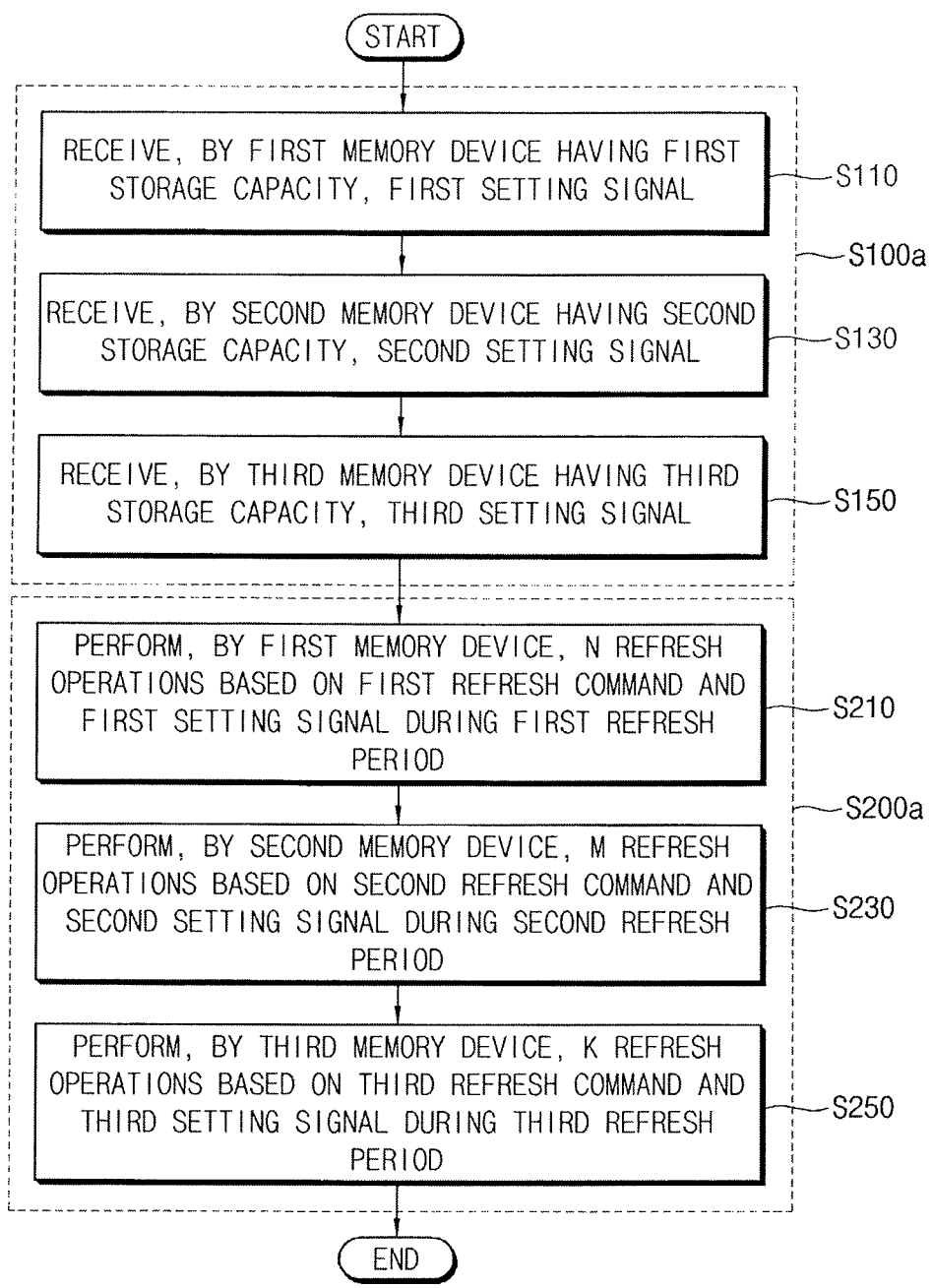
FIG. 11 is a flow chart illustrating a method of operating a memory device according to an example embodiment of the inventive concept.

FIG. 11 is a flow chart illustrating a method of operating a memory device according to an example embodiment of the inventive concept.

Referring to FIG. 11, in a method of operating a memory device according to example embodiments, operations S100a and S200a may be similar to operations S100 and S200 in FIG. 1, respectively.

For example, FIG. 11 illustrates an example where three memory devices having different storage capacities operate based on the method according to an example embodiment of the inventive concept.

In operation S100a, a first setting signal is received by a first memory device (operation S110), a second setting signal is received by a second memory device (operation S130), and a third setting signal is received by a third memory device (operation S150). The three memory devices have respectively different storage capacities. For example, the first memory device has a first storage capacity, the second memory device has a second storage capacity different from the first storage capacity, and the third memory device has a third storage capacity different from the first storage capacity and the second storage capacity. For example, the first, second and third setting signals may be different signals having different values. Refresh conditions of the first, second and third memory devices may be set based on the first, second and third setting signals, respectively.

In operation S200a, based on a first refresh command and the first setting signal, N refresh operations are performed by the first memory device during a first refresh period, where N is a natural number equal to or greater than one (operation S210). Based on a second refresh command and the second setting signal, M refresh operations are performed by the second memory device during a second refresh period, where M is a natural number different from N (operation S230). In addition, in this example, based on a third refresh command and the third setting signal, K refresh operations are performed by the third memory device during a third refresh period, where K is a natural number different from N and M (operation S250). Each of a duration of the second refresh period and a duration of the third refresh period is substantially the same as a duration of the first refresh period. For example, the first, second and third refresh commands may be the same command having the same value.

Figure 12:
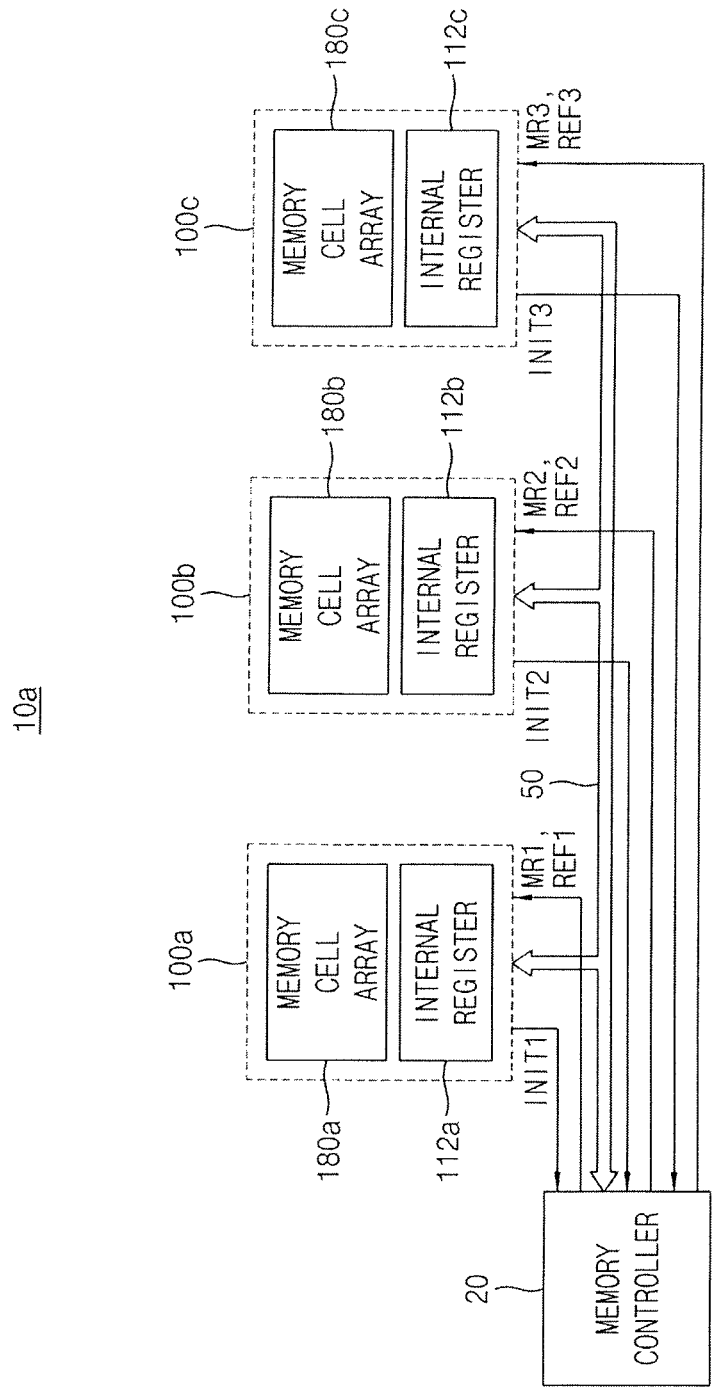
FIG. 12 is a block diagram illustrating a memory system including a memory device according to an example embodiment of the inventive concept.

FIG. 12 is a block diagram illustrating a memory system including a memory device according to an example embodiment of the inventive concept.

Referring to FIG. 12, a memory system 10a includes, for example, a memory controller 20, a channel 50, a first memory device 100a, a second memory device 100b and a third memory device 100c.

The memory system 10a of FIG. 12 may be substantially the same as the memory system 10 of FIG. 1, except that the memory system 10a further includes the third memory device 100c.

The third memory device 100c is electrically connected to the channel 50. The third memory device 100c may be electrically connected to the first and second memory devices 100a and 100b through the channel 50. As with the first and second memory devices 100a and 100b, the third memory device 100c may be a volatile memory device, and may include a third internal register 112c and a third memory cell array 180c. Thus the third memory device 100c would also be refreshed so that a leakage current from the memory cells does not lose or otherwise corrupt the data in the cells of the memory device 100c.

The first, second and third memory devices 100a, 100b and 100c have first, second and third storage capacities, respectively, that are different from one another. For example, the first storage capacity may be greater than the second storage capacity, and the second storage capacity may be greater than the third storage capacity. Thus, the first storage capacity is greater than both the second storage capacity and the third storage capacity, The third memory device 100c receives a third setting signal MR3 from the memory controller 20. A third refresh condition for the third memory device 100c may be set based on the third setting signal MR3. The third setting signal MR3 may be stored into the third internal register 112c. For example, the third setting signal MR3 may be an MRS code signal, and the third internal register 112c may be a mode register.

The third memory device 100c receives a third refresh command REF3 from the memory controller 20. Based on the third refresh command REF3 and the third setting signal MR3 (e.g., based on the third refresh command REF3 and the third refresh condition), K refresh operations may be performed for the third memory device 100c (e.g., for the third memory cell array 180c) during a third refresh period.

In an example embodiment, when the second storage capacity of the second memory device 100b is greater than the third storage capacity of the third memory device 100c, K (representing the number of times in which the third memory device 100c is refreshed during the third refresh period) may be greater than M (representing the number of times in which the second memory device 100b is refreshed during the second refresh period). In an example embodiment, at an initial operation time, the memory controller 20 may determine the third storage capacity of the third memory device 100c by loading a third initial setting value INIT3 for the third memory device 100c. The setting third initial setting value INIT3 may be obtained by the memory controller in a similar manner in which the first initial setting value INIT1 and the second initial setting value INIT2 may be obtained, as discussed herein above.

Figure 13:
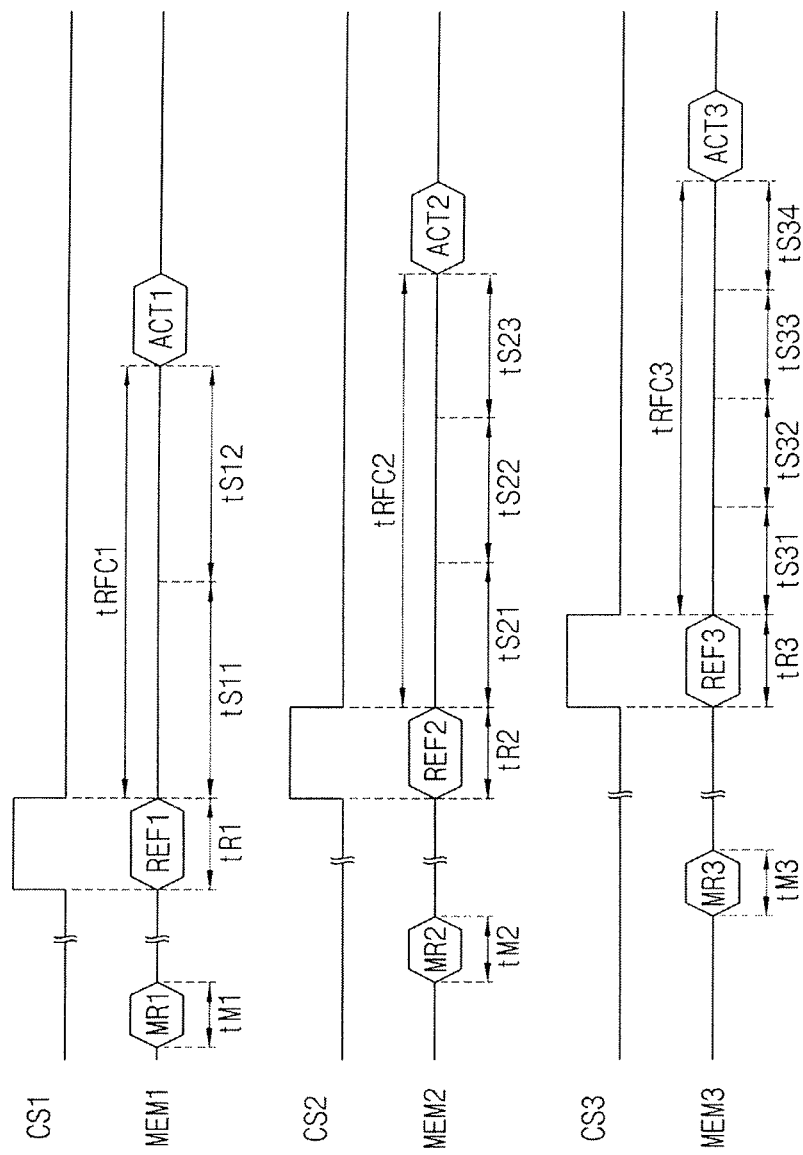
FIGS. 13 and 14 are diagrams for describing the method of operating the memory device of FIG. 11.
Figure 14:
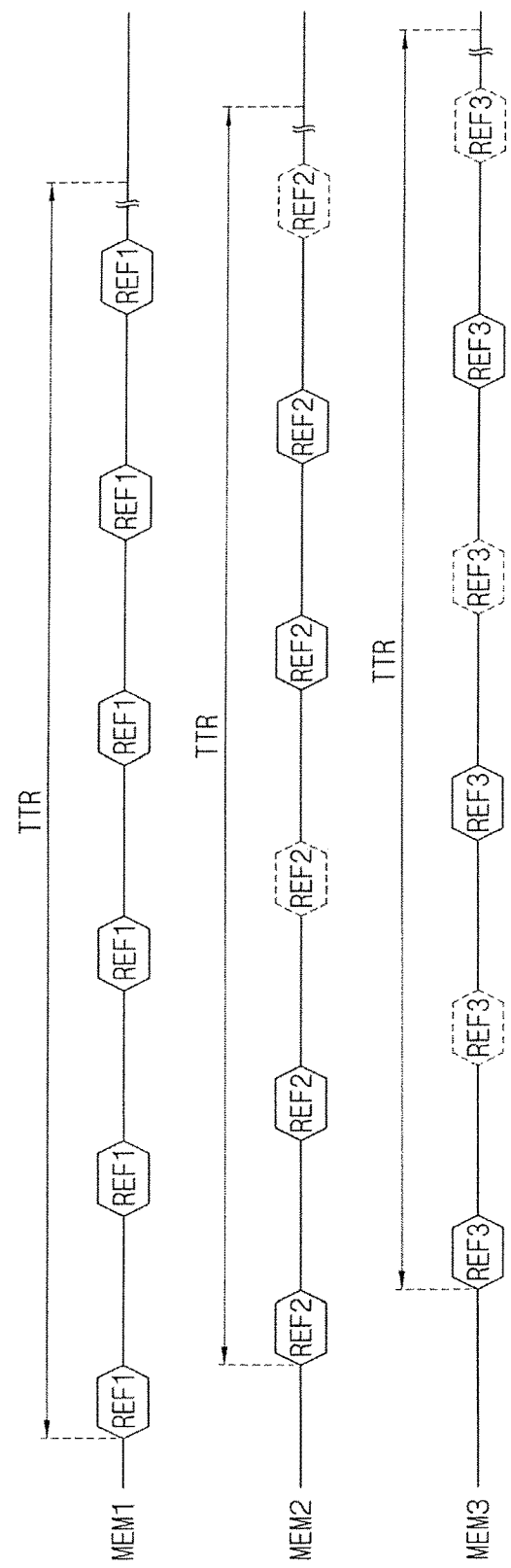

FIGS. 13 and 14 are diagrams for describing the method of operating the memory device of FIG. 11.

In FIGS. 13 and 14, "MEM1" represents signals that are generated from the memory controller 20 and are received by the first memory device 100a, "MEM2" represents signals that are generated from the memory controller 20 and are received by the second memory device 100b, and "MEM3" represents signals that are generated from the memory controller 20 and are received by the third memory device 100c. In FIG. 13, "CS1" represents a first selection signal (e.g., a first chip selection signal) for selecting the first memory device 100a, "CS2" represents a second selection signal (e.g., a second chip selection signal) for selecting the second memory device 100b, and "CS3" represents a third selection signal (e.g., a third chip selection signal) for selecting the third memory device 100c. For convenience of illustration, FIG. 14 illustrates only refresh commands REF1, REF2 and REF3.

Referring to FIGS. 11, 12 and 13, operations of "CS1", "MEM1", "CS2" and "MEM2" in FIG. 13 may be substantially the same as operations of "CS1", "MEM1", "CS2" and "MEM2" in FIG. 7, respectively.

Before the K refresh operations for the third memory device 100c are performed, during a period tM3 after the period tM2, the memory controller 20 generates the third setting signal MR3, and the third memory device 100c receives the third setting signal MR3 from the memory controller 20 through the channel 50 (e.g., operation S150 in FIG. 11). The third refresh condition for the third memory device 100c may be set based on the third setting signal MR3. The third setting signal MR3 may be stored into the third internal register 112c included in the third memory device 100c.

In operation S250, to perform the K refresh operations for the third memory device 100c, during a period tR3 after the period tM3 and the period tR2, the memory controller 20 may generate the third refresh command REF3, the third memory device 100c may be selected based on an activated third selection signal CS3, and the third memory device 100c may receive the third refresh command REF3 from the memory controller 20 through the channel 50. In addition, the third memory device 100c may generate a third refresh address signal based on the third refresh command REF3. Based on the third refresh address signal and the third setting signal MR3, a plurality of third memory cells included in the third memory device 100c may be refreshed K times during a third refresh period tRFC3.

In an example embodiment of the inventive concept, the third refresh period tRFC3 may represent a time interval from a time point at which the third refresh command REF3 is received to a time point at which a third active command ACT3 is received after the reception of the third refresh command REF3.

In an example embodiment of the inventive concept, K may be a natural number equal to or greater than two. In some example embodiment, when the second storage capacity (e.g., about 4 GB) of the second memory device 100b is greater than the third storage capacity (e.g., about 2 GB) of the third memory device 100c, K may be greater than M. For example, as illustrated in FIG. 13, if M is about three and K is about four, the third refresh period tRFC3 may include four sub-periods tS31, tS32, tS33 and tS34. The third memory cells of memory device 100c may be refreshed once during each of the sub periods tS31, tS32, tS33 and tS34. For example, the third refresh address signal may be sequentially changed from a first address to a last address of the third memory cell array 180c during each of the sub-periods tS31, tS32, tS33 and tS34, and thus the third memory cells may be refreshed once based on the third refresh address signal during each of the sub-periods tS31, tS32, tS33 and tS34.

Referring to FIGS. 13 and 14, the number of times in which the first memory device 100a receives the first refresh command REF1 during a reference period TTR, the number of times in which the second memory device 100b receives the second refresh command REF2 during the reference period TTR, and the number of times in which the third memory device 100c receives the third refresh command REF3 during the reference period TTR may be different from one another. However, the total number of times in which the first memory device 100a performs the refresh operation during the reference period TTR, the total number of times in which the second memory device 100b performs the refresh operation during the reference period TTR, and the total number of times in which the third memory device 100c performs the refresh operation during the reference period TTR may be substantially the same as one another. Accordingly, the reference period TTR may include the first, second and third refresh periods tRFC1, tRFC2 and tRFC3.

For example, as described with reference to FIG. 13, the first storage capacity of the first memory device 100a may be greater than the second storage capacity of the second memory device 100b, and the second storage capacity of the second memory device 100b may be greater than the third storage capacity of the third memory device 100c. The first memory device 100a may perform two refresh operations (one in each of tS11 and tS12 based on a single first refresh command REF1 during a single first refresh period tRFC1, the second memory device 100b may perform three refresh operations based on a single second refresh command REF2 during a single second refresh period tRFC2, and the third memory device 100c may perform four refresh operations based on a single third refresh command REF3 during a single third refresh period tRFC3. In this example, although not shown, the first memory device 100a may perform twelve refresh operations by receiving the first refresh command REF1 six times, the second memory device 100b may perform twelve refresh operations by receiving the second refresh command REF2 four times, and the third memory device 100c may perform twelve refresh operations by receiving the third refresh command REF3 three times. Accordingly, as illustrated in FIG. 14, the number of times in which the second memory device 100b receives the second refresh command REF2 during the reference period TTR may be less than the number of times in which the first memory device 100a receives the first refresh command REF1 during the reference period TTR, and the number of times in which the third memory device 100c receives the third refresh command REF3 during the reference period TTR may be less than the number of times in which the second memory device 100b receives the second refresh command REF2 during the reference period TTR.

According to the inventive concept, the second and third memory devices 100b and 100c may perform other operations (e.g., data write/read operations, etc.) during a period (e.g., dotted lines in FIG. 14) in which receptions of the second and third refresh commands REF2 and REF3 are omitted, and thus a memory system including the first, second and third memory devices 100a, 100b and 100c may have relatively increased performance.

Although not illustrated in FIGS. 11 through 14, a method of operating the memory system 10a of FIG. 12 and a method of operating the memory controller 20 in FIG. 12 may be similar to the method of FIG. 9 and the method of FIG. 10, respectively.

For example, in the method of operating the memory system 10a that includes the memory controller 20 and three memory devices 100a, 100b and 100c having different storage capacities, a power signal is applied to the memory system 10a. Storage capacities of the memory devices 100a, 100b and 100c are determined, for example, by the memory controller 20, by loading initial setting values INIT1, INIT2 and INIT3 for the memory devices 100a, 100b and 100c. Different setting signals MR1, MR2 and MR3 for the memory devices 100a, 100b and 100c are generated by the memory controller 20. Based on refresh commands REF1, REF2 and REF3 and the different setting signals MR1, MR2 and MR3, different numbers of refresh operations are performed for the memory devices 100a, 100b and 100c, respectively, during refresh periods having the same duration.

For example, in the method of operating the memory controller 20 connected to the memory devices 100a, 100b and 100c having different storage capacities, storage capacities of the memory devices 100a, 100b and 100c are determined, by the memory controller 20, by loading initial setting values INIT1, INIT2 and INIT3 for the memory devices 100a, 100b and 100c. Different setting signals MR1, MR2 and MR3 for the memory devices 100a, 100b and 100c are generated by the memory controller 20. Refresh commands REF1, REF2 and REF3 for the memory devices 100a, 100b and 100c are generated by the memory controller 20.

The methods according to the inventive concept embodiments may be employed to an example where any number of memory devices are connected to one another by a single channel. Refresh conditions (e.g., the number of times of refresh operations) of memory devices having the same storage capacity may be equally set based on the same setting signal, and refresh conditions of memory devices having the different storage capacities may be differently set based on the different setting signals.

As will be appreciated by those skilled in the art, the inventive concept may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain, or store a program for use by or in connection with an instruction execution system, apparatus, or device. For example, the computer readable medium may be a non-transitory computer readable medium.

Figure 15:
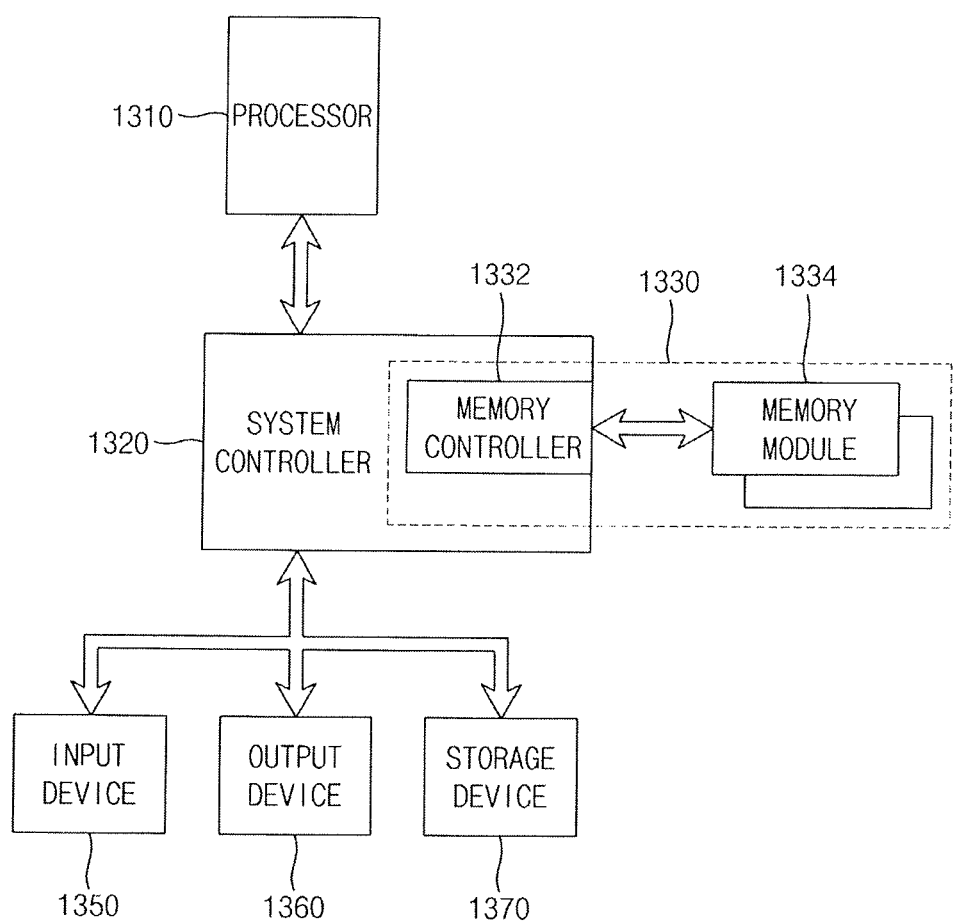
FIG. 15 is a block diagram illustrating a computing system including a memory device according to an example embodiment of the inventive concept.

FIG. 15 is a block diagram illustrating a computing system including a memory device according to example embodiments.

Referring to FIG. 15, a computing system 1300 includes at least one processor 1310, a system controller 1320 and a memory system 1330. The computing system 1300 may further include an input device 1350, an output device 1360 and a storage device 1370.

The memory system 1330 includes a plurality of memory modules 1334, and a memory controller 1332 for controlling the memory modules 1334. The memory modules 1334 may include at least one memory device. The memory controller 1332 may be included in the system controller 1320. The memory device, the memory controller 1332 and the memory system 1330 may operate based on the methods according to example embodiments.

The processor 1310, which includes hardware configured for operation, such as integrated circuitry may perform various computing functions, such as executing specific software instructions for performing specific calculations or tasks. The processor 1310 may be connected to the system controller 1320 via a processor bus. The system controller 1320 may be connected to the input device 1350, the output device 1360 and the storage device 1370 via an expansion bus. The controller also comprises hardware including, for example, integrated circuitry. As such, the processor 1310 may control the input device 1350, the output device 1360 and the storage device 1370 using the system controller 1320.

The inventive concept may be applied to various devices and systems that include memory devices (e.g., volatile memory devices). For example, the inventive concept may be applied to systems such as be a mobile phone, a smart phone, a tablet computer, a laptop computer, a personal digital assistants (PDA), a portable multimedia player (PMP), a digital camera, a portable game console, a wearable system, an internet of things (IoT) system, a virtual reality (VR) system, an augmented reality (AR) system, etc.

The foregoing is illustrative of at least one example embodiment of the inventive concept and is not to be construed as limiting thereof. Although at least one example embodiment of the inventive concept is discussed herein above, those skilled in the art will readily appreciate that many modifications are possible in the example embodiments without materially departing from the novel teachings of the inventive concept. Accordingly, all such modifications are intended to be included within the scope of the present disclosure as defined in the claims. Therefore, a person of ordinary skill in the art should understand and appreciate that the foregoing is illustrative of various example embodiments provided for illustrative purposes and the inventive concept is not to be construed as limited to the specific example embodiments disclosed, and that modifications to the disclosed example embodiments, as well as other example embodiments, are within the scope of the appended claims.

What is claimed is:

1. A method of operating a memory device, the method comprising:
   receiving, by a first memory device from among a plurality of memory devices connected to one another by a single channel, a first setting signal generated based on a first storage capacity of the first memory device;
   receiving, by a second memory device from among the plurality of memory devices, a second setting signal generated based on a second storage capacity of the second memory device different from the first storage capacity;
   performing, by the first memory device, N refresh operations according to the first setting signal during a first refresh period to refresh a charge of the first memory device in response to receipt of a first refresh command from a memory controller, where N is a natural number equal to or greater than one; and
   performing, by the second memory device, M refresh operations according to the second setting signal during a second refresh period to refresh a charge of the second memory device in response to receipt of a second refresh command from the memory controller, where M is a natural number different from N, a duration of the second refresh period being substantially the same as a duration of the first refresh period.

2. The method of claim 1, wherein performing the N refresh operations by the first memory device includes:
   receiving the first refresh command through the single channel;
   generating a first refresh address signal based on the first refresh command; and
   refreshing a plurality of first memory cells included in the first memory device N times based on the first refresh address signal and the first setting signal.

3. The method of claim 2, wherein the received first setting signal is stored in the first memory device, and wherein the plurality of first memory cells are refreshed by loading the stored first setting signal from the first memory device.

4. The method of claim 2, wherein performing the M refresh operations by the second memory device includes:
   receiving the second refresh command through the single channel;
   generating a second refresh address signal based on the second refresh command; and refreshing a plurality of second memory cells included in the second memory device M times based on the second refresh address signal and the second setting signal.

5. The method of claim 4, wherein the received second setting signal is stored in the second memory device, and wherein the plurality of second memory cells are refreshed by loading the stored second setting signal from the second memory device.

6. The method of claim 4, wherein, when performing M refresh operations, M is a natural number equal to or greater than two, wherein the second refresh period includes M sub-periods, and wherein the plurality of second memory cells are refreshed once during each of the M sub-periods.

7. The method of claim 1, wherein the first storage capacity is greater than the second storage capacity, and wherein the second memory device having the second storage capacity performs data write/read operations during a period in which a reception of the second refresh command is omitted.

8. The method of claim 7, wherein M represents a number of times in which the second memory device is refreshed during the second refresh period, and N represents a number of times in which the first memory device is refreshed during the first refresh period, and wherein M is greater than N.

9. The method of claim 8, wherein a number of times in which the second memory device receives the second refresh command during a reference period is less than a number of times in which the first memory device receives the first refresh command during the reference period, and wherein the reference period includes the first and second refresh periods, and the number of times in which the first memory device receives the first refresh command and the second memory device receives the second refresh command is set by a predetermined criterion.

10. The method of claim 1, wherein each of the first and second setting signals comprises a mode register set (MRS) code signal.

11. The method of claim 10, wherein the first setting signal is stored by a first internal register included in the first memory device, and wherein the second setting signal is stored in a second internal register included in the second memory device.

12. The method of claim 1, further comprising:
receiving, by a third memory device among the plurality of memory devices, a third setting signal, the third memory device having a third storage capacity different from the first storage capacity and the second storage capacity; and
performing, by the third memory device, K refresh operations based on a third refresh command generated by the memory controller and the third setting signal during a third refresh period,
where K is a natural number different from N and M, a duration of the third refresh period being substantially the same as the duration of the first refresh period.

13. The method according to claim 1, wherein a number of times in which the first memory device receives the first refresh command during a reference period, and a number of times in which the second memory device receives the second refresh command during the reference period is different from one another.

14. A method of operating a memory system including a memory controller and a plurality of memory devices that are connected to the memory controller and to one another by a single channel, the method comprising:
applying a power signal to the memory system;
determining storage capacities of each one of the plurality of memory devices;
generating a first setting signal for a first memory device from among the plurality of memory devices, the first memory device having a first storage capacity;
generating a second setting signal for a second memory device from among the plurality of memory devices, the second memory device having a second storage capacity less than the first storage capacity;
performing N refresh operations by the first memory device to refresh a charge of memory cells of the first memory device based on a first refresh command and the first setting signal during a first refresh period, where N is a natural number equal to or greater than one; and
performing M refresh operations by the second memory device to refresh a charge of memory cells of the second memory device based on a second refresh command and the second setting signal during a second refresh period,
where M is a natural number greater than N, a duration of the second refresh period being substantially the same as a duration of the first refresh period.

15. The method of claim 14, wherein determining the storage capacities of the plurality of memory devices includes:
determining the first storage capacity of the first memory device by the memory controller loading a first initial setting value for the first memory device; and
determining the second storage capacity of the second memory device by the memory controller loading a second initial setting value for the second memory device.

16. The method of claim 14, wherein the first memory device is mounted on a first memory module, and wherein the second memory device is mounted on a second memory module different from the first memory module, and a first initial setting value for the first memory device and a second initial setting value for the second memory device are stored in a first buffer and a second buffer respectively included in the first memory module and the second memory module.

17. A method of operating a memory device, the method comprising:
receiving, by a first memory device from among a plurality of memory devices connected to one another by a single channel, a first setting signal, the first memory device having a first storage capacity;
receiving, by a second memory device from among the plurality of memory devices, a second setting signal, the second memory device having a second storage capacity different from the first storage capacity;
performing, by the first memory device, N refresh operations to refresh a charge of the first memory device based on a first refresh command generated by a memory controller and the first setting signal during a first refresh period, where N is a natural number equal to or greater than one; and
performing, by the second memory device, M refresh operations to refresh a charge of the second memory device based on a second refresh command generated by the memory controller and the second setting signal during a second refresh period,
where M is a natural number different from N, a duration of the second refresh period being substantially the same as a duration of the first refresh period,
wherein a number of times in which the first memory device receives the first refresh command during a reference period, and a number of times in which the second memory device receives the second refresh command during the reference period is different from one another.

18. The method of claim 17, wherein performing the N refresh operations by the first memory device includes:
   receiving the first refresh command through the single channel;
   generating a first refresh address signal based on the first refresh command; and
   refreshing a plurality of first memory cells included in the first memory device N times based on the first refresh address signal and the first setting signal.

19. The method of claim 18, wherein the received first setting signal is stored in the first memory device, and wherein the plurality of first memory cells are refreshed by loading the stored first setting signal from the first memory device.

20. The method of claim 18, wherein performing the M refresh operations by the second memory device includes:
   receiving the second refresh command through the single channel;
   generating a second refresh address signal based on the second refresh command; and
   refreshing a plurality of second memory cells included in the second memory device M times based on the second refresh address signal and the second setting signal.

21. The method of claim 20, wherein the received second setting signal is stored in the second memory device, and wherein the plurality of second memory cells are refreshed by loading the stored second setting signal from the second memory device.

* * * * *